(12) United States Patent  
Bazylenko et al.

(10) Patent No.: US 6,379,873 B1  
(45) Date of Patent: Apr. 30, 2002

(54) METHOD AND APPARATUS FOR THE CONSTRUCTION OF PHOTOSENSITIVE WAVEGUIDES

(75) Inventors: Michael V. Bazylenko, Forestville; David Moss, Haberfield; Mark Gross, Seaforth; Pak Lim Chu, Bardwell Park, all of (AU)

(73) Assignee: Unisearch Limited, Randwick (AU)

( * ) Notice: Subject to any disclaimer, the term of this patent is extended or adjusted under 35 U.S.C. 154(b) by 0 days.

(21) Appl. No.: 09/029,407

(22) PCT Filed: Sep. 6, 1996

(86) PCT No.: PCT/AU96/00563

§ 371 Date: Dec. 22, 1998

§ 102(e) Date: Dec. 22, 1998

(87) PCT Pub. No.: WO97/09645

PCT Pub. Date: Mar. 13, 1997

(30) Foreign Application Priority Data

Sep. 7, 1995 (AU) .............................. PN5268

(51) Int. Cl.[7] .................. C03B 37/018; C03B 37/01; G02B 6/10; H05H 1/24; G03C 5/16
(52) U.S. Cl. .................... 430/321; 430/935; 430/272.1; 430/290; 427/578; 427/527; 427/531; 427/249.15; 427/250; 427/255.28; 427/255.35; 427/255.395; 385/130; 385/129; 385/37; 65/385; 65/499; 65/415; 65/386; 65/391; 65/425
(58) Field of Search .................... 427/569, 578, 427/527, 531, 249.15, 250, 255.28, 255.35, 255.395; 385/130, 129, 37; 65/385, 399, 415, 386, 391, 425; 430/272.1, 290, 311, 315, 321, 935

(56) References Cited

U.S. PATENT DOCUMENTS

| 4,339,173 A | * | 7/1982 | Aggarwal et al. ........... 385/142 |
| 4,450,787 A | * | 5/1984 | Weakliem et al. ........... 118/723 |
| 5,230,753 A | * | 7/1993 | Wagner ....................... 148/403 |
| 5,506,925 A | * | 4/1996 | Greene et al. ............... 385/129 |
| 5,701,378 A | * | 12/1997 | Tarbox ........................ 385/126 |

FOREIGN PATENT DOCUMENTS

| AU | 35292/95 | 4/1996 |
| EP | 478 984 A1 | * 9/1991 |

OTHER PUBLICATIONS

Svalgaard et al, *Electronics Letters*, Aug. 18, 1994, vol. 30, No. 17, pp. 1401–1403, "Direct UV Writing of Buried Single Mode Channel Waveguides in Ge–Doped Silica Films".*
Kirk–Othmer Encyclopedia of Chemical Technology, vol. 23 (4th Ed.) Published by John Wiley & Sons, Inc. (1997).
International search report dated Nov. 27, 1997.
Hubner et al., Proc. SPIE–Int. Soc. Opt. Eng. 1996, vol. 2695, pp. 98–105, *UV–Written Y–Splitter in Ge–Doped Silica*.

* cited by examiner

Primary Examiner—Janet Baxter  
Assistant Examiner—Sin J. Lee  
(74) Attorney, Agent, or Firm—Marshall, Gerstein, & Borun (57) ABSTRACT

There is disclosed a method of constructing photosensitive waveguides on silicon wafers through the utilization of a Plasma Enhanced Vapor Deposition (PECVD) system. The deposition is utilized to vary the refractive index of resulting structures when they have been subject to Ultra Violet (UV) post processing.

29 Claims, 5 Drawing Sheets

METHOD AND APPARATUS FOR THE CONSTRUCTION OF PHOTOSENSITIVE WAVEGUIDES

TECHNICAL FIELD

The present invention relates to improvements in the control of refractive index of films on substrates, and, more particularly, to a method, apparatus and means of fabrication of photosensitive germanium-doped silica films which change their refractive index upon UV irradiation.

Even more particularly the present invention also relates to the fabrication of photosensitive Germanium-doped silica files using plasma enhanced chemical vapour deposition (PECVD).

Background Art

Photosensitivity in germanosilicate optical-fibres was first observed over 15 years ago. However it was the demonstration UV-written gratings which revived interest in this area. This was followed by writing reflection gratings in the telecommunications window of 1550 nm. These results have stimulated major activity worldwide in this area because such grating devices have a potential major impact on future telecommunications systems.

By coupling UV photosensitivity with planar silica waveguide technology, a very wide range of devices becomes possible and a high degree of integration can be achieved, bringing the benefits of device stability and compactness not available in fibres.

However, prior known germanium doped planar structures have been formed by flame hydrolysis and need to be hydrogen loaded for up to 2 weeks to become reasonably photosensitive. The hydrogen loading introduces unwanted side effects, such as transient behaviour due to gas out diffusion and increased absorption at 1.5 $\mu$m. An alternative deposition technique, which is able to produce photosensitive films without hydrogen loading, is Plasma Enhanced Chemical Vapour Deposition (PECVD). A UV-induced positive refractive index change of 0.0025 has been reported for germanium-doped PECVD silica films without utilising hydrogen loading. These "positive" photosensitive Ge-doped films, however, are deposited by standard high pressure (>50 Pa) PECVD and suffer from a high scattering loss, which makes this material less suitable for the fabrication of planar waveguide devices.

There is therefore a general need for an improved form of silica waveguide which does not suffer, to the same degree, the aforementioned problems.

SUMMARY OF THE INVENTION

In accordance with a first aspect of the present invention there is provided a method of fabricating a photosensitive germanium-doped silica film of a wafer, substrate or the like which is adapted to change its refractive index by a predetermined magnitude and sign upon UV irradiation, said method comprising the selection of deposition conditions for plasma enhanced chemical vapour deposition (PECVD) that result in the formation of a non-porous film.

Preferably the PECVD process is operated so as to control the structure of said film and to produce a film which is adopted to increase its refractive index upon UV irradiation. Alternatively, PECVD process is controlled so as to produce a film which is adopted to decrease its refractive index upon UV irradiation.

The PECVD should be carried out with the level of ion bombardment on the film surface during the deposition necessary for the formation of non-porous silica. The value of the change in refractive index can be adjusted by separately or simultaneously varying the level of ion bombardment and/or the temperature of the wafer, substrate or the like or the level of dopants.

GeH$_4$ can be used as source material for germanium doping and preferably the PECVD process is carried out in a high plasma density hollow cathode deposition system comprising two opposing RF powered electrodes which operate to produce a high density plasma between them due to an "electron mirror" effect. The electrode opposing the wafer holding electrode can be partly screed to produce advantageous effects. The wafer holding electrode can be partly screened with a thin solid round plate having a diameter less than the diameter of the electrode and placed parallel to it and separated from it by a distance smaller than half of the inter-electrode distance.

In a second aspect of the present invention there is provided a photosensitive germanium-doped silica film on a wafer, substrate or the like which is adapted to change its refractive index upon UV irradiation, said film formed by plasma enhanced chemical vapour deposition (PECVD) of the film.

Preferably the PECVD process is operated so as to control the structure of said film and to produce either an increase or decrease in refractive meter upon UV irradiation.

The PECVD process is preferably carried out with the level of ion bombardment on the film surface during the deposition necessary for the formation of non-porous silica and the value of the change in refractive index is adjusted by separately or simultaneously varying the level of ion bombardment and/or the temperature of said wafer, substrate or the like or additionally varying the level of germanium doping.

Preferably GeH$_4$ is used as source material for germanium doping.

The PECVD process can be carried out in a high plasma density hollow cathode deposition system comprising two opposing RF powered electrodes which operate to produce a high density plasma between them due to an "electron mirror" effect. One electrode can be partially screened to produce advantageous effects.

The partial screening can be done with a thin solid round plate having a diameter less than the diameter of the electrode and placed parallel to it and separated from it by a distance smaller than half of the inter-electrode distance.

In yet another aspect of the invention there is provided a method of forming an optical signal processing element on a substrate according to the method described above.

In accordance with a further aspect of the present invention there is provided a method of fabricating a photosensitive germanium doped silica film on a substrate the film adapted to change its refractive index upon UV irradiation, the method comprising utilising a plasma enhanced chemical vapour deposition (PECVD) of said film utilising a level of bombardment of the substrate surface sufficient to cause the formation of substantially non-porous silica.

In accordance with a further aspect of the present invention there is provided a method of fabricating a photosensitive germanium doped silica film on a substrate which is adapted to change its refractive index upon UV radiation, said method comprising plasma enhanced chemical vapour deposition (PECVD) of said film utilising a hollow cathode deposition system.

Preferably, the degree of change in refractive index is determined by varying one or more of:

(a) the level of germanium doping (b) the level of ion bombardment of said substrate (c) the degree of UV irradiation of said substrate The invention also has application in changing the refractive index in respect of one birefringent axis with respect to a second birefringent axis.

In accordance with a further aspect of the present invention there is provided an optical waveguide comprising a photosensitive germanium doped silica film on a substrate, said waveguide adapted to change its refractive index upon UV irradiation, said film being formed from substantially non-porous deposition of said film. The deposition can be via plasma enhanced deposition of said film utilising a hollow cathode deposition system and the degree of change in the refractive index is determined by variation of one or more of:

(a) the level of germanium doping (b) the degree of UV irradiation of said substrate.

BRIEF DESCRIPTION OF THE DRAWINGS

Notwithstanding any other forms which may fall within the scope of the present invention, preferred forms of the invention will now be described, by way of example only, with reference to the accompanying drawings in which.

MODE FOR CARRYING OUT THE INVENTION

A first embodiment of the present invention relies upon the utilisation of plasma enhanced chemical vapour deposition (PECVD).

Figure 1:
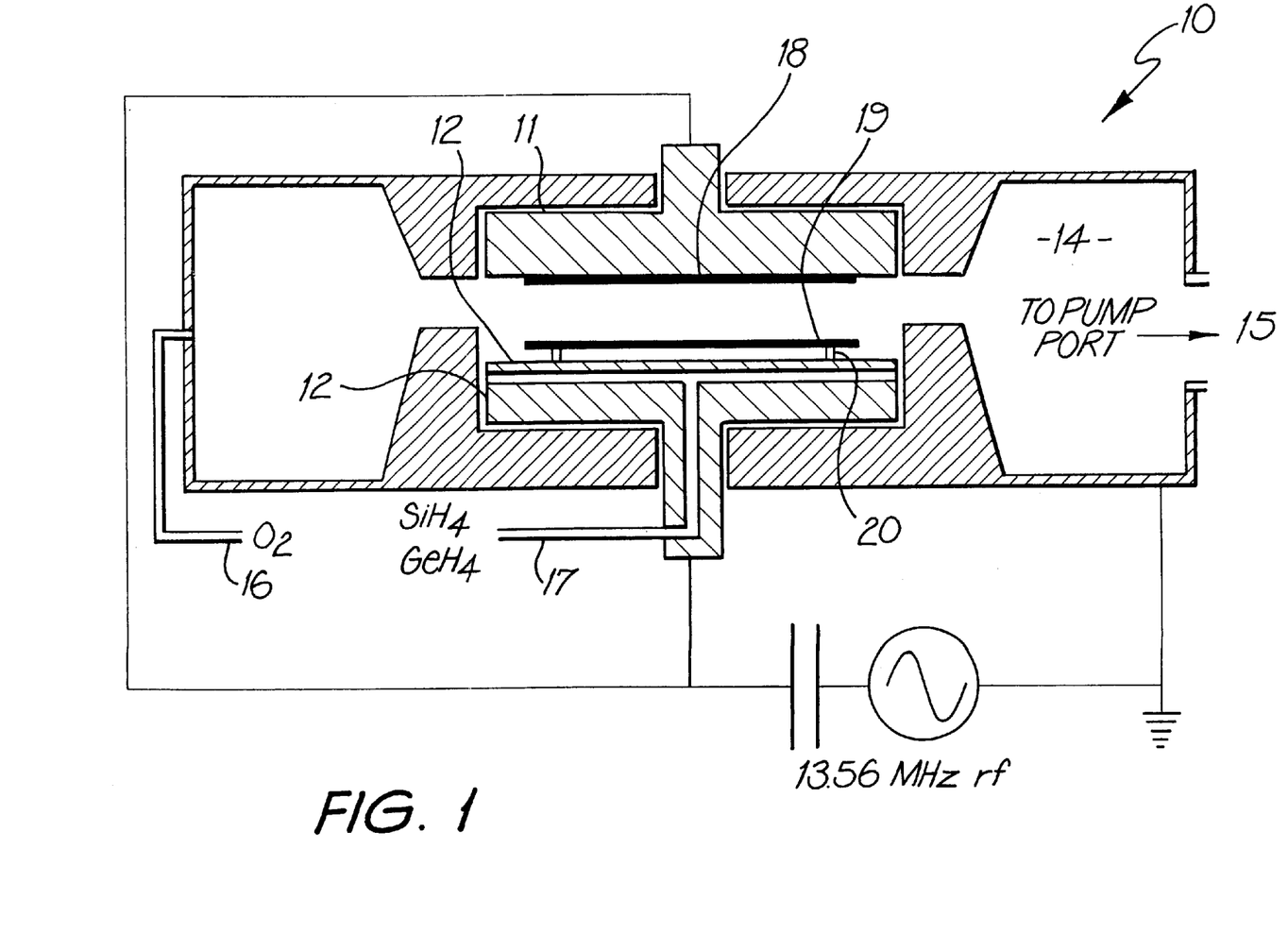
FIG. 1 is a side section schematic view of a chamber suitable for performing PECVD according to embodiments of the invention.

With reference to FIG. 1 there is shown a vacuum chamber assembly 10 including a top electrode 11 and a bottom electrode 12 connected as shown to RF source 13 which comprised a 13.56 MHz RF source. In use for the purposes PECVD, the chamber 14 is evacuated via pump port 15 and gases such as oxygen 16, silane and germane 17 are introduced via corresponding ports so as to cause controlled deposition on wafers or substrates located in the RF field induced plasma located between electrodes 11, 12.

In this instance a first wafer (W1) 18 is mounted on top electrode 11 so as to be at a target potential.

In alternative experiments a second wafer 19, denoted W2, was also mounted near to but spaced apart from bottom electrode 12. The spacing can be performed by ceramic supports 20 so as to electrically isolate wafer 19.

Subsequent utilisation of the PECVD process in the example hereinafter disclosed resulted in the substrates 19,20 coated with a germanium doped silica film. Examples which are described in more detail below of germanium doped silicon films produced by the PECVD process under the conditions specified resulted in the refractive index of the films being selectively controlled by irradiation (typically with a laser) by UV radiation. Conditions can therefore be utilised to produce controlled changes in refractive index of an irradiated portion of a wafer relative to the non-irradiated portions of the wafer. Particular examples of this behaviour will not be described in more detail.

In a first example, Ge-doped silica films were deposited on 2 inch diameter silicon substrates utilising a high plasma density hollow cathode reactor from mixtures of silane ($SiH_4$), germane ($GeH_4$) and oxygen. A suitable dual opposing target hollow cathode reactor was constructed in accordance with the known design as described in: "Hollow Cathode Etching and Deposition", Journal of Vacuum Science and Technology, 1988, A6 at pages 1837–1844.

A series of deposition runs, with varying RF power densities, were carried out at a process pressure of 2 Pa and a $GeH_4$ flow rate of 6 sccm. The $SiH_4$ flow rate was fixed at 20 sccm and the $O_2$ flow rate was determined to give a $SiH_4/O_2$ ratio of approximately 6. No electrode cooling was used. In most of the deposition runs the film was deposited on one wafer 18 clamped in the "face down" position to the top electrode. In one run, however, two wafers were deposited simultaneously. The first wafer w1 18, was clamped to the top electrode in the normal manner, while the second wafer w2 19, was placed on the bottom electrode, but supported slightly above it on three small ceramic spacers e.g. 20. The purpose of the spacers was to reduce the level of ion bombardment on water w2 by reducing its voltage from the bias voltage of the electrode 12 to a potential close to the floating potential of the RF plasma glow. The reduction of ion bombardment is believed to result in increased porosity in the films thereby increasing scattering losses. In practice it was found that the presence of wafer w2 20 also altered the deposition conditions of wafer w1 18 so that the film properties of w1, with and without wafer w2 were observably different.

The OH content and bond structure of the deposited films were determined by Fourier Transform Infrared Spectroscopy (FTIR), and the Ge content by Wavelength Dispersive X-ray Spectroscopy (WDS). The degree of the film porosity was estimated by measuring its etching rate in standard "P-solution". The film stress was also calculated from the substrate curvature, as measured by stylus profilometry.

In initial experiments, the deposited films were subsequently UV exposed using a 193 nm excimer laser with a fluence of 10 kJ/cm². The film refractive index, both before and after UV exposure, was measured using the known prism coupling technique at 633 nm wavelength with measurement repeatability within ±0.00015.

Figure 2:
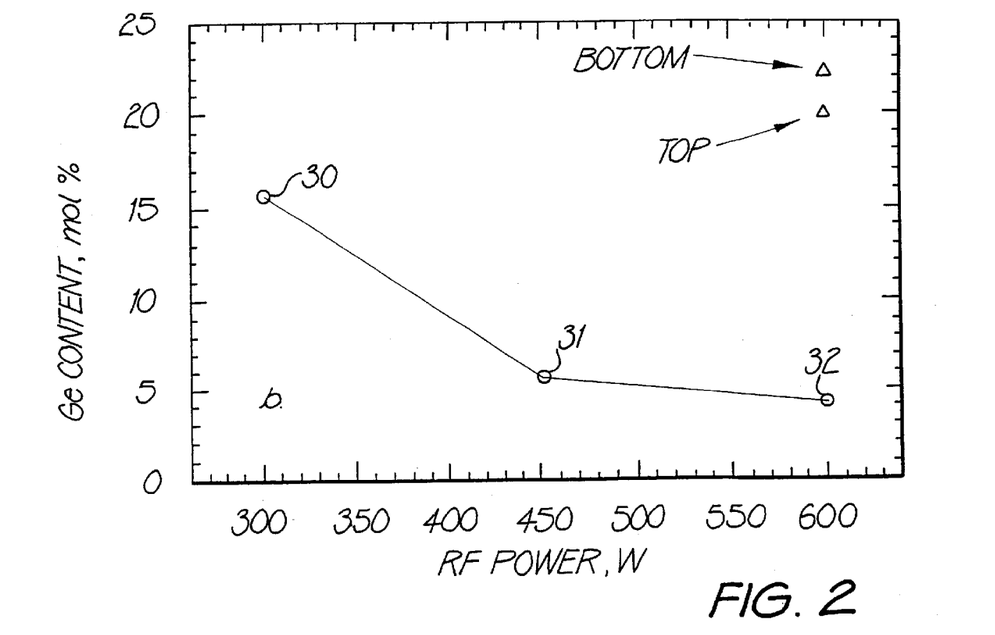
FIG. 2 illustrates a graph of Ge content against RF power for devices manufactured according to embodiments of the invention.

Referring now to FIG. 2, there is shown the Ge content in example films utilised, as a function of the RF power level. The points 30, 31 and 32 represent values measured for a system 10 utilising a single wafer 18 and no secondary wafer 19 and RF power values of 300, 450 and 600 watts respectively. The points 35 and 36 represent values measured for a dual wafer system at 600 watts where point 35 represents the measured value for wafer w1 18 and the point 36 represents the measured value for the wafer w2 19. It can be seen that both the Ge was found to decrease with power for the single wafer deposition. In the case of dual wafers w1 and w2, the Ge content of each wafer was found to be about the same but it was found to be approximately 4 times higher then the case of single wafer deposition at the same power.

Figure 3:
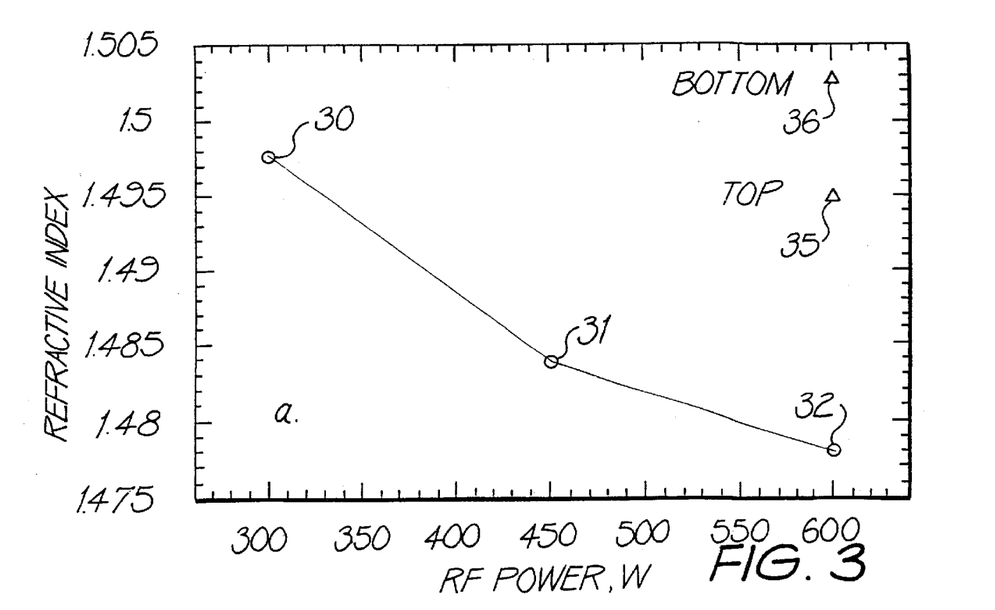
FIG. 3 illustrates a graph of refractive index as a function of RF power for devices manufactured according to embodiments of the invention.
Figure 4:
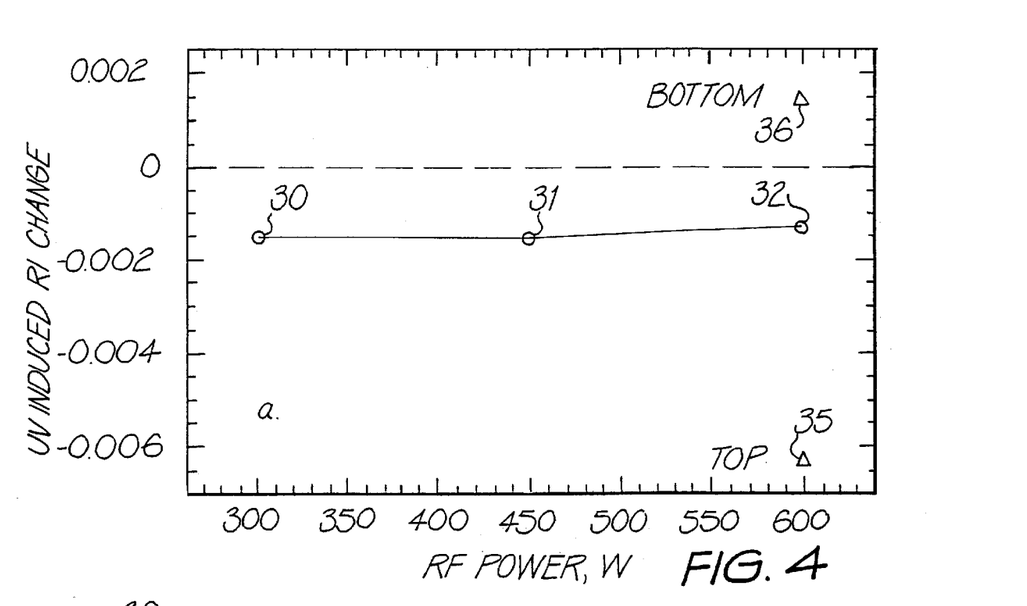
FIG. 4 illustrates a graph of change in refractive index for varying levels of RF power for samples constructed in accordance with the present invention.

FIG. 3 shows the measured film refractive index as a function of RP power. The points marked 30–36 represent the data for the two wafers w1 and w2 as described previously. The results for the single wafer case 30–32 show the refractive index decreasing with power. Also, for the same power level of 600W, the refractive indices in the dual wafer case of both w1 35 and w2 36 are higher than the case of one wafer deposition 32. The change in refractive index after UV irradiation is shown in FIG. 4. Both increases 36 and decreases 35 in refractive index are observed for the two wafer case. Those samples w1 35 placed directly on the electrodes, and thus subjected to ion bombardment during deposition, exhibited a negative refractive index change. It was found that the refractive index decrease for w1 35 (deposited simultaneously with w2 36) was of the order of −0.006. At the same time w2 36, which was separated from the electrode and was receiving decreased ion bombardment, exhibited a positive refractive index change after UV irradiation.

Subsequent scanning electron microscope (SEM) analysis of the silica surface of the wafers w1, w2 after etching in standard P-solution ($HF(60\%):HNO_3(70\%).30H_2O$) for samples deposited in the presence of, and in the absence of, ion bombardment respectively, showed a marked roughness of wafer sample surface for the wafer w2 not subjected to substantial ion bombardment. The roughness being consistent with the P-etch rate being approximately four times higher for the wafer w2 in comparison with the wafer w1. This is consistent with the wafers w2, deposited without ion bombardment, having a significantly higher degree of porosity.

Figure 5:
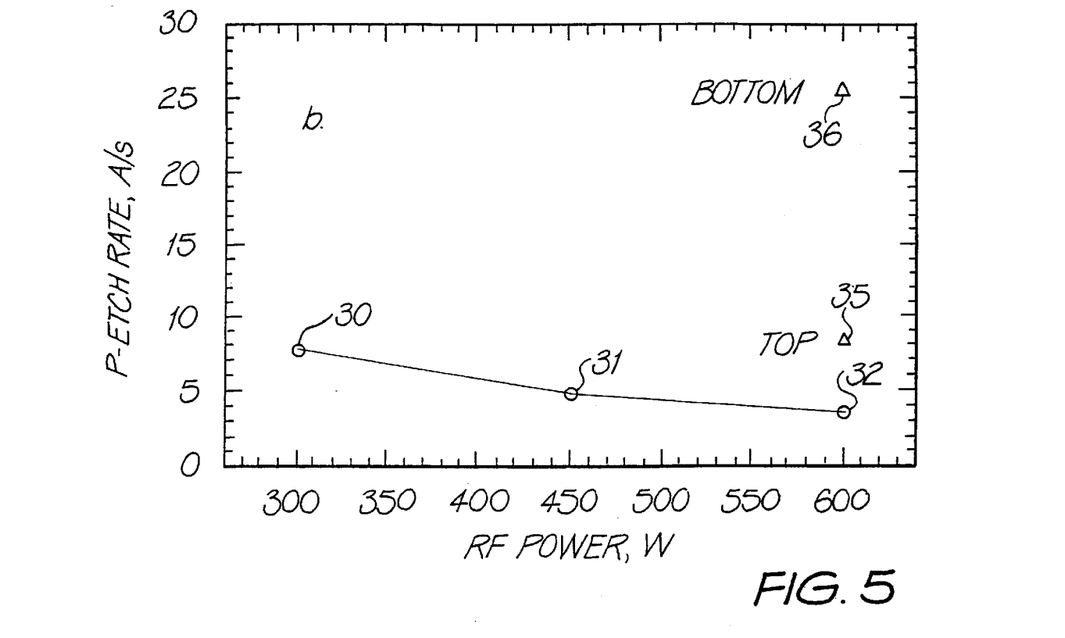
FIG. 5 illustrates a graph of the measured P-etch rate for samples constructed in accordance wih the present invention.

In FIG. 5 there is illustrated a graph of the measured P-etch rate for the various samples 30–36. The measured results were found to confirm the above comments.

Figure 6:
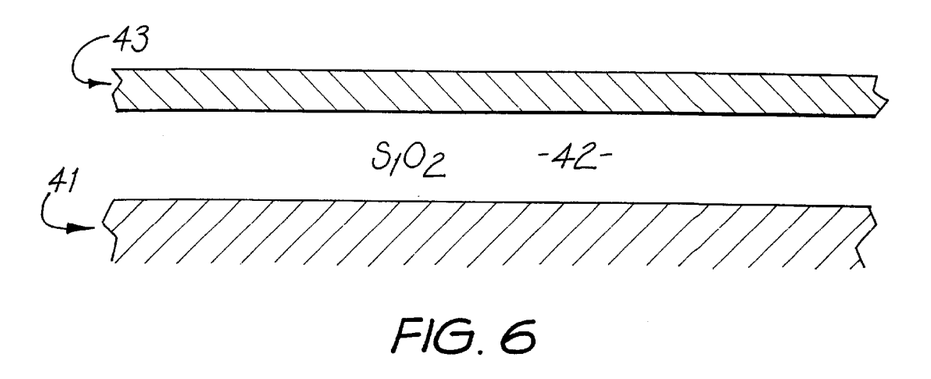
FIG. 6 illustrates a schematic cross section of the construction of an alternative embodiment of the present invention.

Further experiments were then carried out. In a second series of experiments, wafers were initially constructed in accordance with the cross section 40 as illustrated in FIG. 6 with the silica wafer 41 first having a 10 $\mu$m layer of $SiO_2$ 42 laid down as an undoped silica buffer layer. Once layer 42 is prepared, a 3 $\mu$m Ge doped silica layer 43 was subsequently formed in accordance with the aforementioned technique. In a first series of experiments, the $GeO_2$ content was controlled to be 15 mol. % and in a second series of experiments, the $GeO_2$ content was found to be 25 mol. %. The samples were then UV irradiated at various levels and the results plotted. The UV light energy density projected on the surface was normally kept at 0.33 watts per $cm^2$ for all exposures except one exposure where it was increased to 1.4 watts per $cm^2$.

Figure 7A:
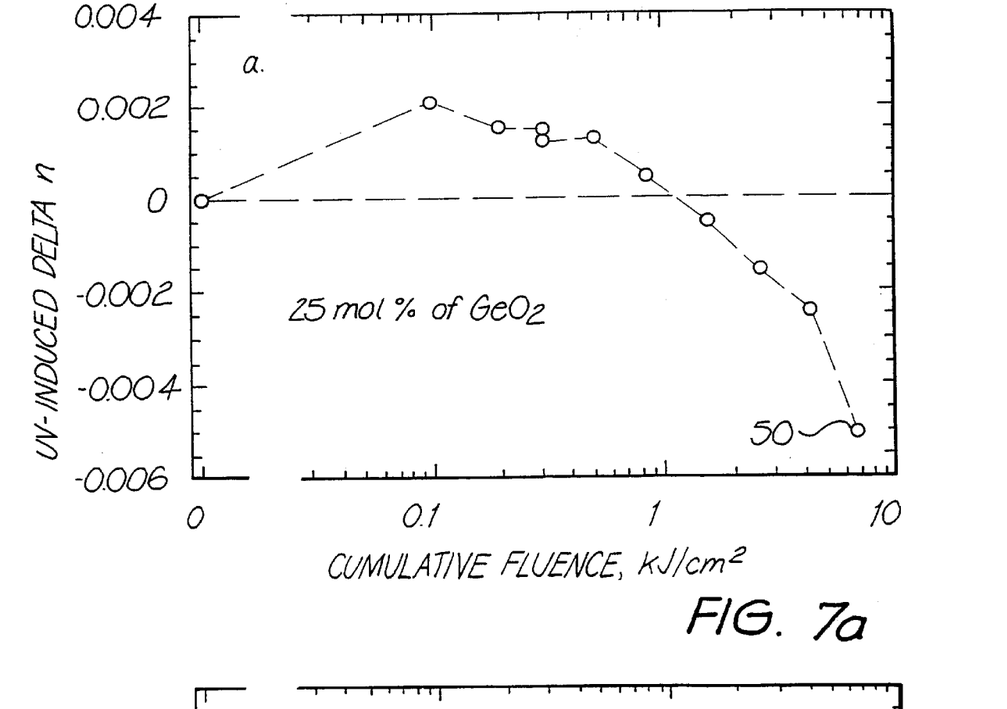
FIGS. 7a and 7b illustrate graphs of change in refractive index for various levels of luminance for an alternative embodiment.

Referring now to FIG. 7a, there is illustrated the consequential change in UV induced refractive index for various levels of accumulative fluence (kJ per $cm^2$) for the case of 25 mol. % of $GeO_2$. All measurements were taken utilising an energy density of exposure of 0.33 watts per $cm^2$ for all exposures except for the exposure 50. It can be noted from FIG. 7a that the change in refractive index was found to vary with the cumulative fluence from initial positive value to negative values as indicated.

Figure 7B:
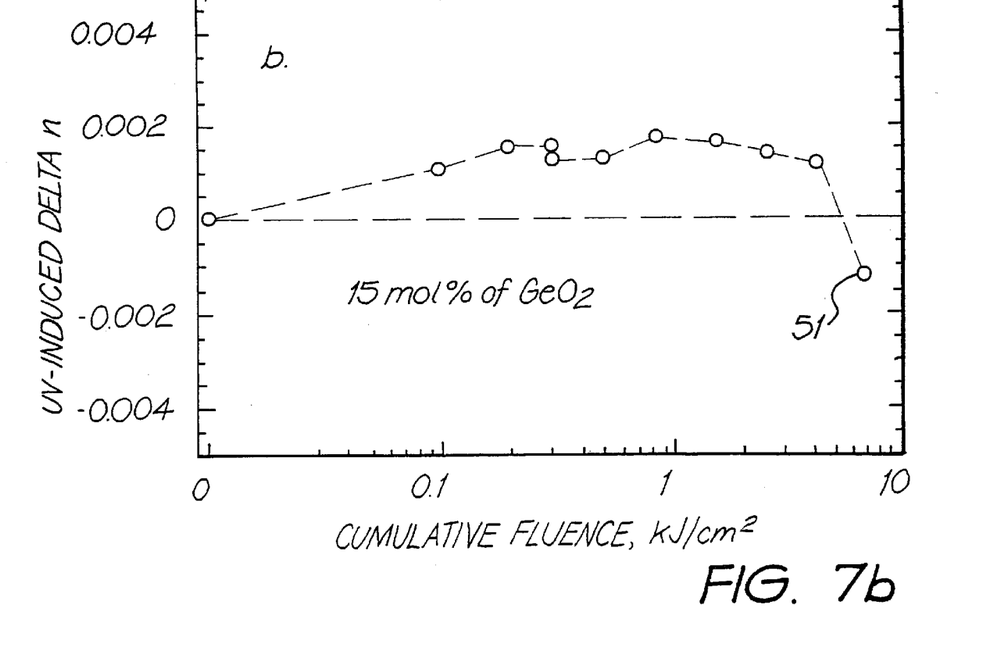

Referring now to FIG. 7b, there is illustrated the 15 mol. % of $GeO_2$ case for various cumulative fluences. It can be seen in comparing FIGS. 7a and 7b that the levels of refractive index change exhibit a dependence on the level of $GeO_2$ in the sample. Again, the point 51 of FIG. 7b was derived from a UV light energy density of 1.4 watts/$cm^2$.

FIGS. 7a and 7b illustrate that the absolute value of the refractive index change is dependent on the total fluence in addition to the TV power density. Further, larger refractive index changes have been observed for the higher Ge content sample thus implying its higher photosensitivity compared to the lower Ge content sample. Photosensitivity further appears to increase with Ge content.

Figure 8:
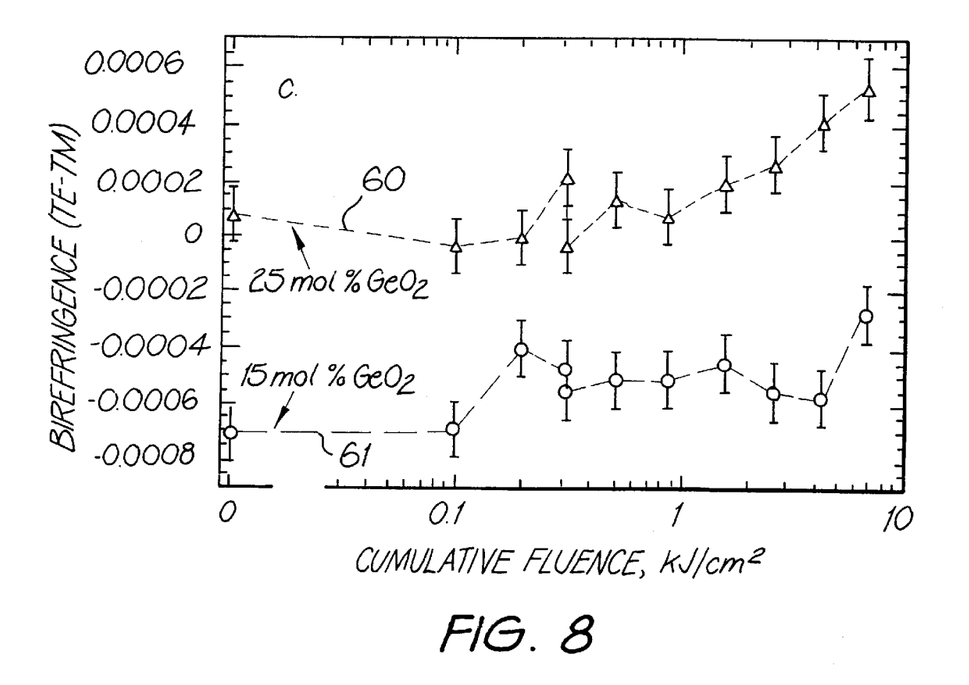
FIG. 8 illustrates a graph of relative birefringence for various levels of fluence for an alterntive embodiment of the present invention.

The results of FIG. 7a and FIG. 7b were obtained for TE polarised light injected into the waveguide. The TE polarised light is where the electric field vector is parallel to the substrate. In FIG. 8, there is illustrated the birefringence, being the difference between the refractive indices for TE and TM polarised light, with the TM electric filed vector being perpendicular to the substrate, as a function of fluence. The measured results comprising curve 60 being measured for a wafer having 25 mol. % $GeO_2$ and the curve 61 representing those values measured for a wafer having 15 mol. % $GeO_2$. It can be seen that the birefringence was found to vary both with the cumulative fluence and the degree of concentration of $GeO_2$.

In general, it is thought that the increase in RF power coupled into the discharge leads to an increase in both the wafer temperature and the level of ion bombardment on the film surface, due to the increase in both ion flux and average energy of ions impinging on the surface. Further, a simultaneous increase in the temperature of the wafer and the level of ion bombardment on the film surface causes a decrease in both the Ge content (and hence refractive index) and the OH content.

It would be appreciated by a person skilled in the art that numerous variations and/or modifications may be made to the present invention as shown in the specific embodiments without departing from the spirit or scope of the invention as broadly described. The methods presented can readily be utilised in the construction of waveguide structures having predetermined refractive index profiles in accordance with requirement. The present embodiments are, therefore, to be considered in all respects to be illustrative and not restrictive.

What is claimed is:

1. A method of fabricating a photosensitive germanium-doped silica film on a substrate by plasma enhanced chemical vapour deposition (PECVD), said film being arranged to undergo a change in refractive index by a predetermined magnitude and sign upon UV irradiation, said method comprising:

performing the PECVD under deposition conditions that enable the film to form as a non-porous film and to undergo the change in refractive index.

2. A method as claimed in claim 1, wherein the step of performing the PECVD includes employing a level of ion bombardment of the film surface during deposition to form the non-porous film.

3. A method as claimed in claim 2, wherein $GeH_4$ is used as a source material to dope the film with germanium.

4. A method as claimed in claim 2, further comprising carrying out the PECVD process in a high plasma density hollow cathode deposition system comprising two opposing RF-powered electrodes which operate to produce a high density plasma between them due to an "electron mirror" effect.

5. A method as claimed in claim 1 wherein said film is germanium doped utilizing $GeH_4$ as a source material.

6. A method as claimed in claim 1 wherein the PECVD process is carried out in a high plasma density hollow cathode deposition system comprising two opposing RF powered electrodes which operate to produce a high density plasma between them due to an "electron mirror" effect.

7. A method as claimed in claim 6 wherein the electrode opposing the wafer holding electrode is partly screened.

8. A method as claimed in claim 7 wherein said wafer holding electrode is partly screened with a thin solid round plate having a diameter less than the diameter of the electrode and placed parallel to it and separated from it by a distance smaller than half of the inter-electrode distance.

9. A method as claimed in claim 1 wherein said change in refractive index is in respect of one birefringent axis relative to a second birefringent axis.

10. A method of fabricating a photosensitive germanium-doped silica film on a substrate by plasma enhanced chemical vapour deposition (PECVD), said film being arranged to undergo a decrease in refractive index by a predetermined magnitude, said method comprising:

performing the PECVD under deposition conditions that enable the film to undergo the decrease in refractive index.

11. A method as claimed in claim 10, wherein said decrease in refractive index is in respect of one birefringent axis relative to a second birefringent axis.

12. A method as claimed in claim 10, wherein $GeH_4$ is used as a source material to dope the film with germanium.

13. A method as claimed in claim 10, further comprising carrying out the PECVD process in a high plasma density hollow cathode deposition system comprising two opposing RF-powered electrodes which operate to produce a high density plasma between them due to an "electron mirror" effect.

14. A photosensitive germanium-doped silica film on a wafer, substrate or the like which is adapted to change its refractive index upon UV irradiation, said film formed by plasma enhanced chemical vapour deposition (PECVD) of the film wherein deposition conditions of the PECVD are chosen in a manner such as to control the magnitude and sign oil the UV-induced refractive index change of the film, wherein the PECVD process is operated so as to control the structure of said film so as to form a film of non-porous silica.

15. A film as claimed in claim 14 wherein the deposition conditions of the PECVD are chosen in a manner such as to produce a film which is adapted to decrease its refractive index upon UV irradiation.

16. A film as claimed in claim 14 wherein a level of ion bombardment on the film surface during the deposition necessary for the formation of non-porous silica is chosen.

17. A film as claimed in claim 14 wherein a level of ion bombardment and/or the temperature of said wafer, substrate or the like are chosen separately or simultaneously in a manner such as to control the magnitude and sign of the refractive index change.

18. A film as claimed in claim 14 wherein said film is germanium doped utilizing $GeH_4$ as a source material.

19. A film as claimed in claim 14 wherein the PECVD process is carried out in a high plasma density hollow cathode deposition system comprising two opposing RF powered electrodes which operate to produce a high density plasma between them due to an "electron mirror" effect.

20. A film as claimed in claim 19, wherein an electrode opposing a substrate-holding electrode is partly screened.

21. A film as claimed in claim 19, wherein a substrate-holding electrode is partly screened with a thin solid round plate having a diameter less than the diameter of the electrode and placed parallel to and separated from the substrate-holding electrode by a distance smaller than half of an inter-electrode distance.

22. A film as claimed in claim 14 wherein said film is capable of forming an optical signal processing element on said substrate.

23. A film as claimed in claim 14 wherein said change in refractive index is in respect of one birefringent axis of the film relative to a second birefringent axis of the film.

24. A method of fabricating a photosensitive germanium-doped silica film on a substrate by plasma enhanced chemical vapour deposition (PECVD) in a hollow cathode deposition system, said film being a arranged to undergo a change in refractive index by a predetermined magnitude and sign upon UV irradiation, the method comprising:

performing the PECVD under deposition conditions that enable the film to undergo the change in refractive index, wherein the predetermined magnitude of change in refractive index is produced by varying one or more of:
(a) the level of ion bombardment of said substrate; and
(b) the degree of UV irradiation of said substrate.

25. A method as claimed in claim 24 wherein the PECVD plasma is created by two opposing RF powered electrodes which operate to produce a high density plasma between them.

26. A method as claimed in claim 25 wherein one of said electrodes is partially screened.

27. A method as claimed in claim 25 wherein said substrate is substantially at the potential of a corresponding one of said electrodes.

28. A method as claimed in claim 25 wherein said substrate is substantially at the potential of said plasma.

29. A method as claimed in claim 24 wherein said change is in respect of one birefringent axis with respect to a second birefringent axis.

* * * * *

UNITED STATES PATENT AND TRADEMARK OFFICE
CERTIFICATE OF CORRECTION

PATENT NO. : 6,379,873 B1
DATED : April 30, 2002
INVENTOR(S) : Bazylenko et al.

It is certified that error appears in the above-identified patent and that said Letters Patent is hereby corrected as shown below:

Column 6,
Line 66, replace with the following: -- A method as claimed in 1, wherein $GeH_4$ is used as a source material to dope the film with germanium. --

Column 7,
Line 8, replace with the following: -- A method as claimed in claim 6, wherein a substrate-holding electrode is partly screened with a thin solid round plate having a diameter less than the diameter of the electrode and being placed parallel to and separated from the substrate-holding electrode by a distance smaller than half of an inter-electrode distance. --
Line 13, replace "claim 1 wherein" with -- claim 1, wherein --.
Line 35, replace with the following: -- A non-porous photosensitive germanium-doped silica film deposited on a substrate, the film being arranged to undergo a chance in refractive index by a predetermined magnitude and sign upon UV irradiation, said film being formed by plasma enhanced chemical vapour deposition (PECVD) in which deposition conditions of the PECVD are chosen so as to enable the film to row with a non-porous structure and to undergo the change in refractive index. --
Line 45, replace with the following: -- A film as claimed in claim 14, wherein the such film is arranged to decrease its refractive index upon UV irradiation. --
Line 49, replace with the following: -- A film as claimed in claim 14, wherein during the deposition, the film is ion bombarded at a level sufficient to form the non-porous film. --

Columns 7-8,
Lines 53-3, replace with the following: -- A film as claimed in claim 14, wherein during the deposition, a level of ion bombardment and/or the temperature of said substrate are selected so as to enable the film to undergo the refractive index change. --

Column 8,
Line 4, replace "claim 14 wherein" with -- claim 14, wherein --.
Line 6, replace "claim 14 wherein" with -- claim 14, wherein --.
Line 8, replace "RF powered" with -- RF-powered --.
Line 19, replace with -- A film as claimed in claim 14, wherein said film is in the form of an optical signal processing element on said substrate. --

UNITED STATES PATENT AND TRADEMARK OFFICE
CERTIFICATE OF CORRECTION

PATENT NO.    : 6,379,873 B1
DATED         : April 30, 2002
INVENTOR(S)   : Bazylenko et al.

It is certified that error appears in the above-identified patent and that said Letters Patent is hereby corrected as shown below:

<u>Column 8, cont'd,</u>
Line 22, replace "claim 14 wherein" with -- claim 14, wherein --.
Line 38, replace "claim 24 wherein" with -- claim 24, wherein --.
Line 39, replace "RF powered" with -- RF-powered --.
Line 42, replace "claim 25 wherein" with -- claim 25, wherein --.
Line 44, replace "claim 25 wherein" with -- claim 25, wherein --.
Line 47, replace "claim 25 wherein" with -- claim 25, wherein --.
Line 49, replace "claim 24 wherein" with -- claim 24, wherein --.
Line 50, replace with -- A method as claimed in claim 24, wherein said change is refractive index is in respect of one birefringent axis relative to a second birefringent axis. --

Signed and Sealed this

Twenty-fifth Day of November, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,379,873 B1
DATED : April 30, 2002
INVENTOR(S) : Bazylenko et al.

It is certified that error appears in the above-identified patent and that said Letters Patent is hereby corrected as shown below:

Column 7,
Line 24, replace with the following:
-- A film as claimed in claim 10, wherein said change in refractive index is in respect of one birefringent axis of the film relative to a second birefringent axis of the film. --.

Signed and Sealed this

Third Day of February, 2004

JON W. DUDAS
*Acting Director of the United States Patent and Trademark Office*